United States Patent
Ko

(10) Patent No.: US 9,246,127 B2
(45) Date of Patent: Jan. 26, 2016

(54) ORGANIC LIGHT EMITTING DIODE DISPLAY

(71) Applicant: Samsung Display Co., Ltd., Yongin (KR)

(72) Inventor: Young-Soo Ko, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 135 days.

(21) Appl. No.: 14/147,047

(22) Filed: Jan. 3, 2014

(65) Prior Publication Data

US 2015/0021567 A1    Jan. 22, 2015

(30) Foreign Application Priority Data

Jul. 19, 2013 (KR) .......... 10-2013-0085306

(51) Int. Cl.
*H01L 51/52* (2006.01)

(52) U.S. Cl.
CPC .......... *H01L 51/5246* (2013.01); *H01L 51/524* (2013.01)

(58) Field of Classification Search
CPC .......... H01L 51/5246; H01L 51/5259
USPC .......... 257/40
See application file for complete search history.

(56) References Cited

U.S. PATENT DOCUMENTS

| | | | |
|---|---|---|---|
| 2011/0121714 A1* | 5/2011 | Kim et al. .......... | 313/317 |
| 2014/0264813 A1* | 9/2014 | Lin et al. .......... | 257/690 |

FOREIGN PATENT DOCUMENTS

| | | |
|---|---|---|
| JP | 2009-026505 | 2/2009 |
| KR | 10-2005-0028560 | 3/2005 |
| KR | 10-0835256 | 5/2008 |
| KR | 10-2013-0017916 | 2/2013 |

* cited by examiner

*Primary Examiner* — Tran Tran
(74) *Attorney, Agent, or Firm* — H.C. Park & Associates, PLC

(57) ABSTRACT

An organic light emitting diode display includes a first substrate, an organic light emitting element, a sealant, and a second substrate. The first substrate includes a first groove disposed in a display area of the organic light emitting diode display and a second groove disposed outside the display area. The organic light emitting element is at least partially disposed in the first groove. The sealant is at least partially disposed in the second groove. The second substrate is disposed on the first substrate. The organic light emitting element is sealed between the first substrate and the second substrate via at least the sealant.

19 Claims, 4 Drawing Sheets

ORGANIC LIGHT EMITTING DIODE DISPLAY

CROSS-REFERENCE TO RELATED APPLICATION

This application claims priority from and the benefit of Korean Patent Application No. 10-2013-0085306, filed on Jul. 19, 2013, which is incorporated by reference for all purposes as if set forth herein.

BACKGROUND

1. Field

Exemplary embodiments relate to display technology, and, more particularly, to organic light emitting diode displays.

2. Discussion

Organic light emitting diode displays are a type of self-emissive display that can generate light without an independent light source, as opposed to liquid crystal displays. In this manner, organic light emitting diode displays may be more thin and lighter than conventional non-self-emissive displays. Further, organic light emitting diode displays may consume relatively lower amounts of power, produce relatively higher amounts of luminance, and respond more quickly to changing images. Conventional organic light emitting diode displays typically include a first substrate, an organic light emitting diode (OLED) disposed on the first substrate, a second substrate opposite the first substrate with the OLED disposed therebetween. In this manner, a sealant, such as a frit, may be utilized to couple (e.g., cohere and seal) the first substrate and the second substrate together to, for example, protect the OLED from external contaminants. It is noted, however, that an overall thickness of an organic light emitting diode display may be increased due to the thickness of the OLED and/or the sealant.

The above information disclosed in this Background section is only for enhancement of understanding of the inventive concept, and, therefore, it may contain information that does not form the prior art that is already known in this country to a person of ordinary skill in the art.

SUMMARY

Exemplary embodiments provide an organic light emitting diode display that is thinner than conventional organic light emitting diode displays.

Additional aspects will be set forth in the detailed description which follows and, in part, will be apparent from the disclosure, or may be learned by practice of the inventive concept.

According to exemplary embodiments, an organic light emitting diode display, includes: a first substrate including a first groove disposed in a display area of the organic light emitting diode display and a second groove disposed outside of the display area; an organic light emitting element at least partially disposed in the first groove; a sealant at least partially disposed in the second groove; and a second substrate disposed on the first substrate. The organic light emitting element is sealed between the first substrate and the second substrate via at least the sealant.

According to exemplary embodiments, a display device, includes: a first substrate including a first groove disposed in a display area and a second groove disposed outside of the display area; a light emitting element at least partially disposed in the first groove; a sealant at least partially disposed in the second groove; and a second substrate disposed on the first substrate. The sealant couples the first substrate and the second substrate together to seal the light emitting element between the first substrate and the second substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain principles of the inventive concept.

DETAILED DESCRIPTION OF THE ILLUSTRATED EMBODIMENTS

Figure 1:
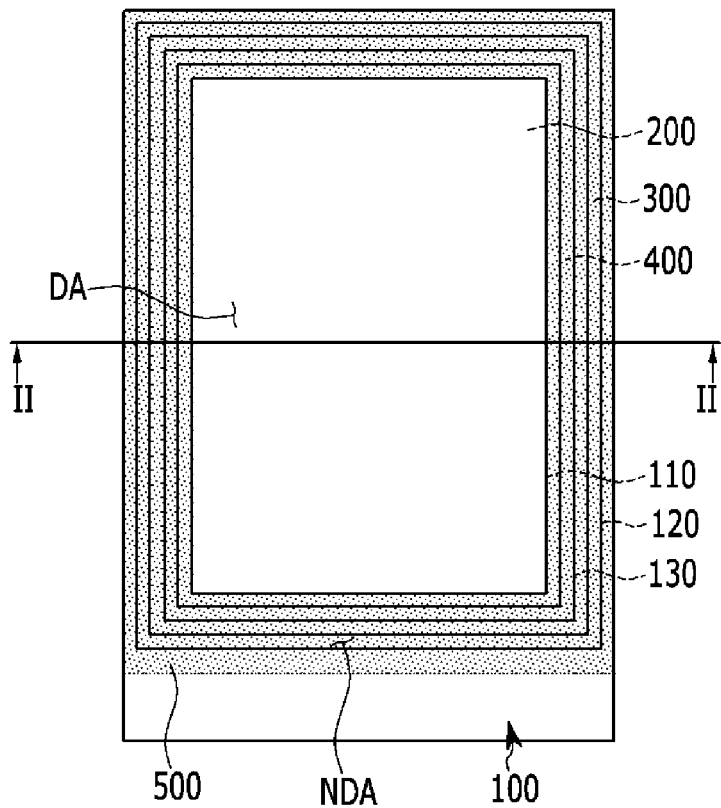
FIG. 1 is a schematic plan view of an organic light emitting diode display, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature (s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
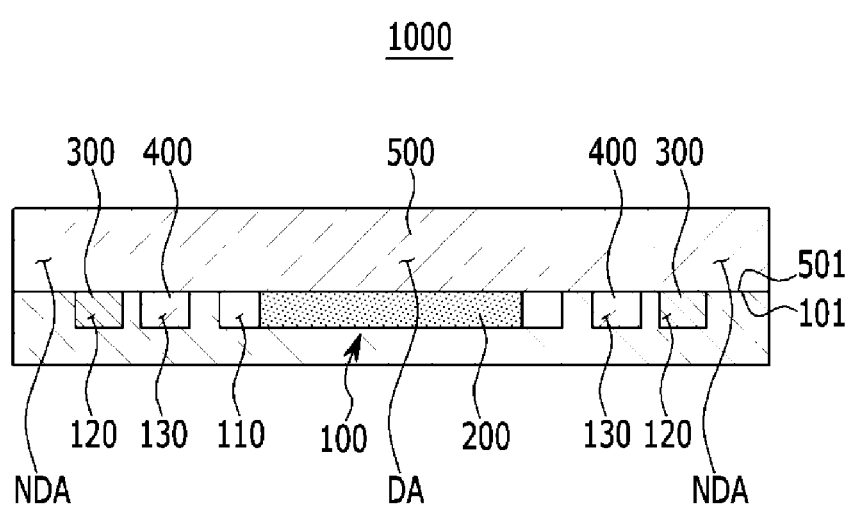
FIG. 2 is a cross-sectional view of the organic light emitting diode display of FIG. 1 taken along sectional line II-II, according to exemplary embodiments.

FIG. 1 is a schematic plan view of an organic light emitting diode display, according to exemplary embodiments. FIG. 2 is a cross-sectional view of the organic light emitting diode display of FIG. 1 taken along sectional line II-II.

As shown in FIGS. 1 and 2, the organic light emitting diode display(or display) 1000 may include a display area DA to display an image, and a non-display area NDA that may at least partially surround the display area DA. To this end, the display 1000 may include a first substrate 100, an organic light emitting element 200, a sealant 300, a getter 400, and a second substrate 500. Although specific reference will be made to this particular implementation, it is also contemplated that display 1000 may embody many forms and include multiple and/or alternative components.

According to exemplary embodiments, the first substrate 100 and the second substrate 500 may be formed of any suitable insulating substrate material, such as, for example, glass, quartz, ceramic, metal, plastic, and/or the like. It is noted that when the first substrate 100 and the second substrate 500 are made of plastic, the display 1000 may be a flexible, stretchable, and/or rollable display. When, for instance, the first substrate 100 and the second substrate 500 are made of glass, a portion of a first surface 101 of the first substrate 100 corresponding to the non-display area NDA may be brought into contact with a corresponding portion of a second surface 501 of the second substrate 500. It is noted that the portions of the first surface 101 of the first substrate 100 and the second surface of the second substrate 500 that are brought into contact with one another may be optically polished to function as optical surfaces.

In exemplary embodiments, the first substrate 100 may include a first groove 110, a second groove 120, and a third groove 130. The first groove 110 may be a recess in the first substrate 100 that is formed in correspondence with the display area DA. In this manner, the organic light emitting element 200 may be disposed in the first groove 110. The second groove 120 may form another recess in the first substrate 100. The second groove may be formed in the non-display area NDA. It is noted that the second groove 120 may surround the first groove 110. To this end, the sealant 300 may be disposed in the second groove 120. The third groove 130 may be yet another recess in the first substrate 100 that is formed in the non-display area NDA between the first groove 110 and the second groove 120. That is, the third groove 130 may be disposed between the first groove 110 and the second groove 120, and, thereby, may surround the first groove 110. The getter 400 may be disposed in the third groove 130.

As previously mentioned, the organic light emitting element 200 may be disposed in the first groove 110, which may be formed in the display area DA of the organic light emitting diode display 1000. The organic light emitting element 200 may be configured to emit light to facilitate the display of images via display 1000. Although not illustrated, the organic light emitting element 200 may include an organic emission layer disposed between a first (e.g., lower) electrode and a second (e.g., upper) electrode. One of the first and second electrodes may be an anode electrode, which may function as a hole injection electrode. The other of the first and second electrodes may be a cathode electrode, which may function as an electron injection electrode. At least one of the first and second electrodes may be formed of a light transmissive material to enable light emitted from the organic emission layer to propagate through the at least one of the first and second electrodes toward an observer (not shown).

According to exemplary embodiments, the organic emission layer may be configured to emit light of at least one color, such as, for example, red, green, blue, white, and the like. When the organic emission layer is configured to emit white light, one or more color filters (not shown) may be disposed in the path of emitted light to change (or otherwise affect) the wavelength(s) of light perceived by the observer. In other words, the organic light emitting element 200 may display an image by emitting light of one or more colors. It is noted that a thickness of the organic light emitting element 200 may be adjusted so that an upper surface of the organic light emitting element 200 may be coplanar with or disposed below the first surface 101 of the first substrate 100. That is, the organic light emitting element 200 may be sized to enable the organic light emitting element 200 to be completely disposed in the first groove 110.

Although not illustrated, a circuit unit may be disposed between the organic light emitting element 200 and the first substrate 100. A corresponding circuit unit may be provided in each of the display area DA and non-display area NDA. In this manner, wires including one or more scan lines, data lines, driving power lines, common power lines, and/or the like may be connected between the corresponding circuit units. A pixel circuit (not shown) including two or more switching units (e.g., thin film transistors (TFT)) connected to one or more of the wires may be utilized to control the emission of light via the organic light emitting elements 200. It is noted that the pixel circuit may also include one or more capacitors and/or any other suitable component. Any suitable circuit structure may be utilized in association with the corresponding circuit units and the pixel circuits.

According to exemplary embodiments, the sealant 300 may include a frit, which is a high temperature melting adhesive using glass powder as a main material. It is noted that the sealant 300 may be cured to enable or enhance its effectiveness. As previously mentioned, the sealant 300 may be disposed in the second groove 120 formed in the first substrate 100 in the non-display area NDA. To this end, the second groove 120 may surround the organic light emitting element 200, and, thereby, the first groove 110 in which the organic light emitting element 200 may be disposed. In this manner, the sealant 300 may be disposed between the first substrate 100 and the second substrate 500 in the second groove 120, and, thereby, configured couple the first substrate 100 to the second substrate 200. As such, the sealant 300 may seal (e.g., hermitically seal) the organic light emitting element 200 in a region between the first substrate 100 and the second substrate 500. In exemplary embodiments, the sealant 300 may contain lead oxide (PbO), boron trioxide ($B_2O_3$), silicon dioxide ($SiO_2$), and/or the like. Further, the sealant 300 may contain a resin, such as, for example, an epoxy. As seen in FIG. 2, a height of a top surface of the sealant 300 may be coplanar (or substantially coplanar) with the first surface 101 of the first substrate 100.

The getter 400 may be disposed between the organic light emitting element 200 and the sealant 300 to surround the organic light emitting element 200. As seen in FIG. 2, the getter 400 may be disposed in the third groove 130 formed in the first substrate 100 in the non-display area NDA. In this manner, a top surface of the getter 400 may be coplanar (or substantially coplanar) with the first surface 101 of the first substrate 100. As such, the getter 400 may be disposed between the first substrate 100 and the second substrate 500 in the third groove 130.

In exemplary embodiments, the getter 400 may react with moisture and/or oxygen existing between the first substrate 100 and the second substrate 500 to remove the moisture and/or oxygen. As such, the getter 400 may be utilized to prevent (or otherwise reduce) damage to the organic light emitting element 200 that may otherwise be caused by the moisture and/or oxygen. The getter 400 may contain any suitable material, such as, for example, at least one of barium (Ba), calcium (Ca), magnesium (Mg), titanium (Ti), vanadium (V), zirconium (Zr), niobium (Nb), molybdenum (Mo), tantalum (Ta), thorium (Th), cerium (Ce), aluminum (Al), nickel (Ni), etc.

According to exemplary embodiments, each of the first substrate 100 and the second substrate 500 is made of glass, and the first surface 101 of the first substrate 100 is coupled to the second surface 501 of the second substrate 500 as a result of a strong bond formed between the first surface 101 of the first substrate 100 (which may be optically polished in the non-display area NDA) that is brought into contact with the second surface 501 of the second substrate 500 (which may also be optically polished in the non-display area NDA). The strong bond formed between the second surface 501 of the second substrate 500 and the first surface 101 of the first substrate 100 in the non-display area NDA may be achieved via a covalent bond acting between first molecules associated with the first surface 101 of the first substrate 100 and second molecules associated with the second surface 501 of the second substrate 500, each of which may be optically polished as an optical surface. That is, intermolecular forces acting between the first molecules associated with the first surface 101 and the second molecules associated with the second surface 501 may cause, at least in part, a strong covalent bond between the optically polished surfaces 101 and 501.

In exemplary embodiments, silica ($Si_xO_y$) may be utilized to form each of the first substrate 100 and the second substrate 500. It is noted that silica in each of the first substrate 100 and the second substrate 500 may be covalently bonded to silica in the other of the first substrate 100 and the second substrate 500 based on an induced dipole in each of the first molecules associated with the first substrate 100 and the second molecules associated with the second substrate 300. In this manner, dipole-dipole forces acting between the first molecules and the second molecules form strong covalent bonds between the first molecules of the first substrate 100 and the second molecules of the second substrate 500.

According to exemplary embodiments, since each of the first surface 101 of the first substrate 100 and the second surface 501 of the second substrate 500 may be optically polished, the first surface 101 of the first substrate 100 and the second surface 501 of the second substrate 500 may be brought in closer contact with each other due to van der Waals forces acting between the first surface 101 and the second surface 501. In other words, by optically polishing the first surface 101 and the second surface 501, dispersive adhesion between the first substrate 100 and the second substrate 500 may occur. This dispersive adhesion, in turn, enables a larger number of the first modules and the second molecules at the interface between the first surface 101 and the second surface 501 to be covalently bonded. As such, the first surface 101 of the first substrate 100 and the second surface 501 of the second substrate 500 may be more strongly bonded to one another.

According to exemplary embodiments, since the display 1000 may include the organic light emitting element 200, the sealant 300, and the getter 400 respectively disposed in the first groove 110, the second groove 120, and the third groove 130, the display 1000 may be manufactured thinner than conventional display devices. Further, the first substrate 100 and the second substrate 500 may be coupled to each other by the sealant 300, and the first surface 101 of the first substrate 100 and the second surface 501 of the second substrate 500 may be covalently bonded to one another in the non-display area NDA. As such, deformation in the frames of the first substrate 100 and the second substrate 500 in the non-display area NDA may be prevented or at least reduced. In other words, due to the configuration of the display 1000, the first substrate 100 and/or the second substrate 500 may not be deformed, which may prevent stresses from building in the display 1000. This, in turn, may prevent (or at least lessen) the potential for damage that may otherwise occur upon external impact to the display 1000.

Further, according to exemplary embodiments, the first substrate 100 and the second substrate 500 may be strongly bonded to one another via covalent bonds formed in the non-display area NDA, as well as coupled to one another via the sealant 300. As such, external moisture, debris, etc., may be prevented from permeating into the display 1000, and, thereby, prevented from damaging or degrading the organic light emitting element 200. To this end, while the second surface 501 and the first surface 101 are strongly bonded to each other to form an outer boundary, the first substrate 100 and the second substrate 500 may also be sealed together via the sealant 300 to form an internal boundary. In this manner, the getter 400 may be disposed within the internal boundary provided by the sealant 300 to provide yet another form of internal boundary. As such, external moisture may be prevented from reaching the organic light emitting element 200 to prevent damage and/or degradation thereof. This may improve the life-span of the organic light emitting element 200 due to the various moisture-blocking boundaries provided by the first substrate 100, the second substrate 500, the sealant 300, and the getter 400.

Figure 3:
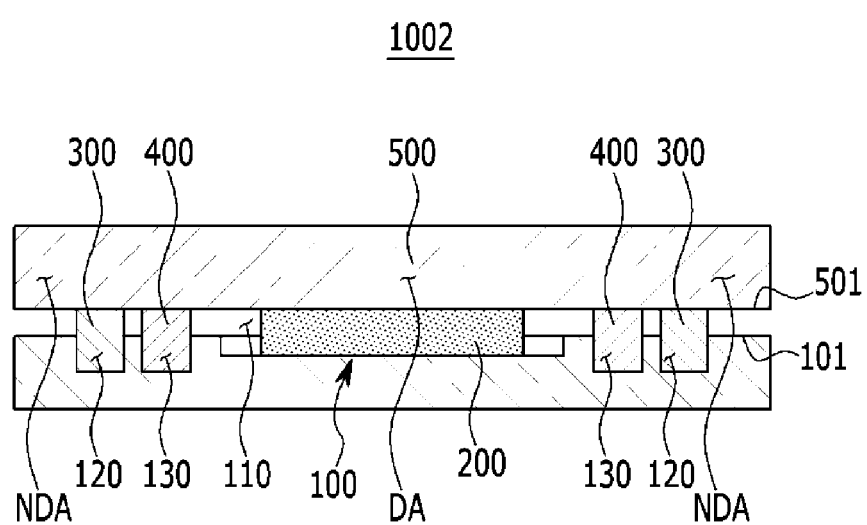
FIG. 3 is a cross-sectional view of an organic light emitting diode display, according to exemplary embodiments.

FIG. 3 is a cross-sectional view of an organic light emitting diode display, according to exemplary embodiments. It is noted that the organic light emitting diode display (or display) 1002 of FIG. 3 is substantially similar to the organic light emitting diode display 1000 of FIG. 1. To avoid obscuring exemplary embodiment described herein, primarily differences are provided below.

As shown in FIG. 3, portions of the second surface 501 of the second substrate 500 associated with the non-display area NDA may be spaced apart from the first surface 101 of the first substrate 100 by a determined distance. In this manner, the height of the top surfaces of the sealant 300 and the getter 400 may each be taller than the first surface 101 of the first substrate 100 (or extend further towards the second surface 501 than the first surface 101). As such, the organic light emitting element 200, the sealant 300, and the getter 400 may be respectively disposed in the first groove 110, the second groove 120, and the third groove 130, but may each respective extend therefrom. Even still, because the organic light emitting element 200, the sealant 300, and the getter 400 are at least partially recessed in the first groove 110, the second groove 120, and the third groove 130, the thickness of the display 1002 may still be thinner than conventional display devices.

Further, according to exemplary embodiments, since the top surfaces of the sealant 300 and the getter 400 may be higher than that of the first surface 101 of the first substrate 100, the first surface 101 of the first substrate 100 and the second surface 501 of the second substrate 500 may be separated by a determined distance. This determined distance may be adjusted to satisfy various manufacturing processing conditions, while at the same time, enabling the manufacture of a display 1002 of reduced thickness.

Figure 4:
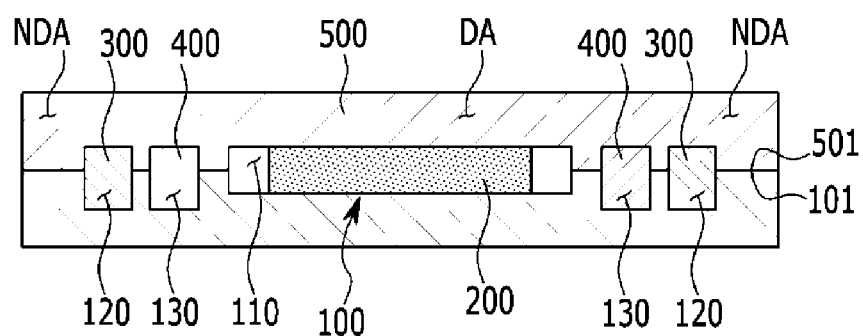
FIG. 4 is a cross-sectional view of an organic light emitting diode display, according to exemplary embodiments.

FIG. 4 is a cross-sectional view of an organic light emitting diode display, according to exemplary embodiments. It is noted that the organic light emitting diode display (or display) 1004 of FIG. 4 is substantially similar to the organic light emitting diode display 1000 of FIG. 1. To avoid obscuring exemplary embodiment described herein, primarily differences are provided below.

As seen in FIG. 4, the first groove 110, the second groove 120, and the third groove 130 are respectively formed in each of the first substrate 100 and the second substrate 500 of display 1004. In this manner, the organic light emitting element 200 may be disposed in each of the first grooves 110 formed in the first substrate 100 and the second substrate 500.

In a similar fashion, the sealant 300 may be respectively disposed in each of the second grooves 120 formed in the first substrate 100 and the second substrate 500. To this end, the getter 400 may be respectively disposed in each of the third grooves 130 formed in the first substrate 100 and the second substrate 500.

According to exemplary embodiments, since the first groove 110, the second groove 120, and the third groove 140 may be formed in both the first substrate 100 and the second substrate 500, each of the first grooves 110, the second grooves 120, and the third grooves 130 may be more shallow as compared to the first groove 110, the second groove 120, and the third groove 130 of display 1000. In other words, because the first grooves 110, the second grooves 120, and the third grooves 130 in display 1004 can be more shallowly formed than in display 1000, the structural integrity of the first substrate 100 and the second substrate 500 may be maintained with respectively thinner versions of the first substrate 100 and the second substrate 500. In this manner, the aggregate depth of the first grooves 110, the second grooves 120, and the third grooves 130 in display 1004 may be substantially similar to the depth of the first groove 110, the second groove 120, and the third groove 130 formed in substrate 100 of display 1000, but the overall thickness of display 1004 may be thinner than display 1000.

As such, because the organic light emitting element 200, the sealant 300, and the getter 400 are correspondingly recessed in the first grooves 110, the second grooves 120, and the third grooves 130 formed in each of the first substrate 100 and the second substrate 200, the thickness of the display 1004 may be thinner than conventional display devices, but may also be thinner than as described in association with display 1000 of FIG. 1, as the first substrate 100 and the second substrate 500 may be formed thinner.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. An organic light emitting diode display, comprising:
a first substrate comprising a first groove disposed in a display area of the organic light emitting diode display and a second groove disposed outside of the display area;
an organic light emitting element at least partially disposed in the first groove, the organic light emitting element comprising:
a first surface contacting a bottom surface of the first groove; and
a second surface opposing the first surface;
a sealant entirely disposed in the second groove; and
a second substrate disposed on the first substrate, the sealant directly contacting the first substrate and the second substrate,
wherein:
the second surface of the organic light emitting diode is coplanar with at least one surface of the first substrate;
the organic light emitting element is sealed between the first substrate and second substrate via the sealant; and
the at least one surface of the first substrate is directly bonded to at least one surface of the second substrate via a covalent bond.

2. The organic light emitting diode display of claim 1, wherein:
the first substrate further comprises a third groove disposed between the first groove and the second groove; and
the organic light emitting diode display further comprises a getter at least partially disposed in the third groove.

3. The organic light emitting diode display of claim 2, wherein each of the second groove and the third groove surrounds the first groove.

4. The organic light emitting diode display of claim 3, wherein each of the sealant and the getter surrounds the organic light emitting element.

5. The organic light emitting diode display of claim 1, wherein at least one surface of the first substrate disposed outside the display area and at least one surface of the second substrate disposed outside the display area contact one another.

6. The organic light emitting diode display of claim 5, wherein each of the first substrate and the second substrate comprises glass.

7. The organic light emitting diode display of claim 6, wherein the at least one surface of the first substrate and the at least one surface of the second substrate are each optically polished surfaces.

8. The organic light emitting diode display of claim 1, wherein the respective surfaces of the first substrate and the second substrate disposed outside of the display area are spaced apart from one another.

9. The organic light emitting diode display of claim 2, wherein the third groove is further disposed outside of the display area.

10. The organic light emitting diode display of claim 1, wherein the organic light emitting element is disposed completely within the first groove.

11. The organic light emitting diode display of claim 2, wherein the second substrate comprises:
a fourth groove disposed in association with the first groove;
a fifth groove disposed in association with the second groove; and
a sixth groove disposed in association with the third groove,
wherein the organic light emitting element is disposed in each of the first and fourth grooves, the sealant is disposed in each of the second and fifth grooves, and the getter is disposed in each of the third and sixth grooves.

12. A display device, comprising:
a first substrate comprising a first groove disposed in a display area and a second groove disposed outside of the display area;
a light emitting element at least partially disposed in the first groove, the light emitting element comprising:
a first surface contacting a bottom surface of the first groove; and
a second surface opposing the first surface;
a sealant entirely disposed in the second groove; and
a second substrate disposed on the first substrate, the sealant directly contacting the first substrate and the second substrate,
wherein:
the second surface of the light emitting element is coplanar with the at least one surface of the first substrate
the sealant couples the first substrate and the second substrate together to seal the light emitting element between the first substrate and the second substrate, and
the at least one surface of the first substrate is directly bonded to at least one surface of the second substrate via a covalent bond.

13. The display device of claim 12, further comprising:
a getter disposed outside the display area,
wherein the first substrate further comprises a third groove disposed between the first groove and the second groove, the getter being at least partially disposed in the third groove.

14. The display device of claim 13, wherein the second groove surrounds each of the first groove and the third groove.

15. The display device of claim 14, wherein:
the getter surrounds the light emitting element; and
the sealant surrounds the getter.

16. The display device of claim 14, wherein the second substrate comprises:
a fourth groove aligned with the first groove;
a fifth groove aligned with the second groove; and
a sixth groove aligned with the third groove,
wherein the light emitting element is disposed in each of the first and fourth grooves, the sealant is disposed in each of the second and fifth grooves, and the getter is disposed in each of the third and sixth grooves.

17. The display device of claim 12, wherein the light emitting element is disposed completely within the first groove.

18. The display device of claim 12, wherein the at least one surface of the first substrate and the at least one surface of the second substrate are optically polished surfaces.

19. The organic light emitting diode display of claim 1, wherein:
the second groove is disposed in a first area outside of the display area;
the covalent bond is disposed in a second area outside of the display area; and
the first area is disposed between the second area and the display area.

* * * * *